United States Patent [19]

Bache et al.

[11] Patent Number: 5,032,243

[45] Date of Patent: Jul. 16, 1991

[54] METHOD AND APPARATUS FOR FORMING OR MODIFYING CUTTING EDGES

[75] Inventors: Roger J. Bache, Lower Earley; Colin F. Parker, Tilehurst, both of England

[73] Assignee: The Gillette Company, Boston, Mass.

[21] Appl. No.: 460,858

[22] PCT Filed: Sep. 6, 1989

[86] PCT No.: PCT/US89/03850

§ 371 Date: Mar. 16, 1999

§ 102(e) Date: Mar. 16, 1990

[30] Foreign Application Priority Data

Sep. 19, 1988 [GB] United Kingdom ............... 8821944

[51] Int. Cl.$^5$ ............................................. C23F 4/04
[52] U.S. Cl. ........................... 204/192.34; 204/298.36; 156/345; 156/643
[58] Field of Search .......... 204/192.3, 192.34, 298.36; 156/345, 643

[56] References Cited

U.S. PATENT DOCUMENTS

| | | | |
|---|---|---|---|
| 3,740,327 | 6/1973 | Lane et al. | 204/298.11 |
| 3,761,374 | 9/1973 | Bromer et al. | 204/192.11 |
| 4,128,765 | 12/1978 | Franks | 250/442.1 |
| 4,599,135 | 7/1986 | Tsunekawa et al. | 156/643 |

Primary Examiner—Aaron Weisstuch
Attorney, Agent, or Firm—John P. Morley

[57] ABSTRACT

A method of forming or modifying the cutting edges of razor blades, and apparatus for carrying out the method. The method comprises subjecting a stack of razor blades (12) to ion bombardment from two ion sources (13, 14) in a vacuum chamber (10), the ion sources being located on opposite sides of a plane (15) which lies within the stack and parallel to the major surfaces of the blades and the ion sources having the axes of their ion beams directed at the edges of the razor blades in the stack.

16 Claims, 7 Drawing Sheets

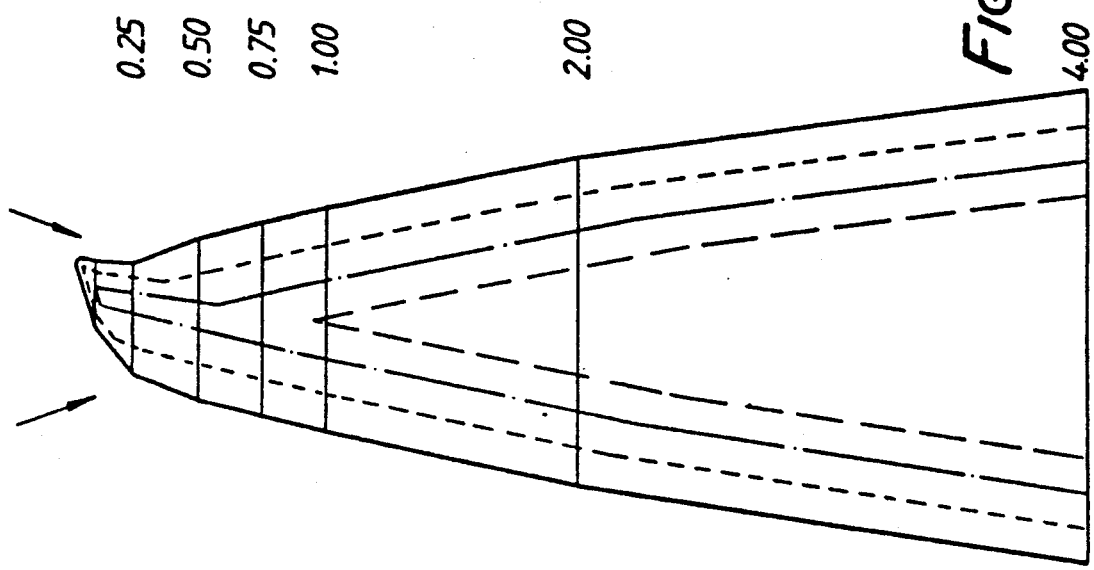
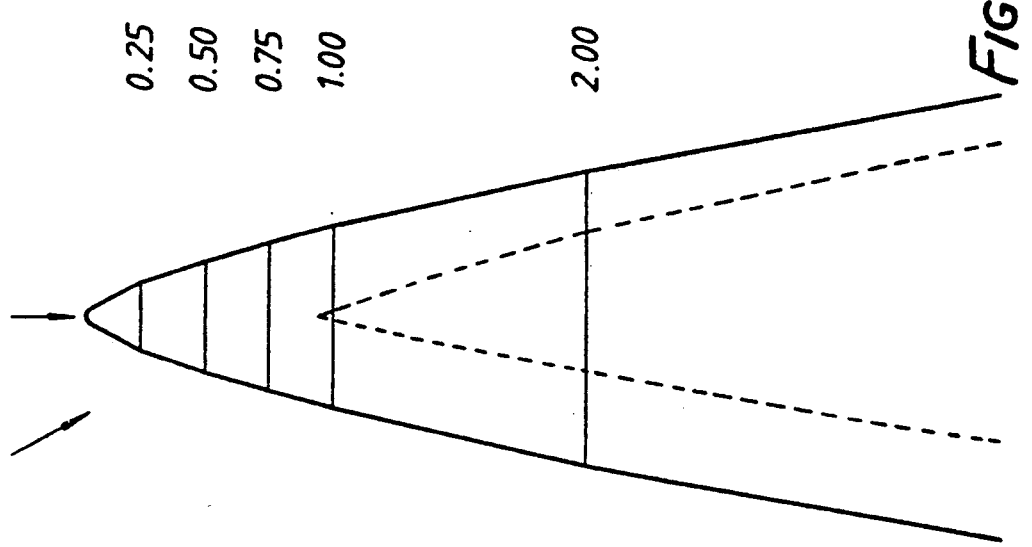

METHOD AND APPARATUS FOR FORMING OR MODIFYING CUTTING EDGES

This invention is concerned with a method and apparatus for forming or modifying cutting edges by ion bombardment to cause sputter removal of the material of the workpiece. The invention is particularly, but not exclusively, useful in forming very thin ("ultra fine") cutting edges for razor blades.

Theoretical studies and experimental work carried out by us have shown that the shaving performance of razor blades would be significantly improved if the thickness of the cutting edge over a distance back from the ultimate tip was substantially less than that of currently available razor blades. (For the avoidance of doubt the term "cutting edge" is used in this specification to refer to the whole marginal zone of a razor blade which is bounded by tapering surfaces or, in everyday parlance, is sharpened, while "ultimate tip" is used to refer to the final edge or tip of the razor blade; in conventional razor blades, the cutting edge extends some 400–500 $\mu$m back from the ultimate tip). The minimum thickness of the cutting edge is determined by the yield or fracture strength of the blade material.

British Specification 2130955A describes such a cutting edge which has a cross-sectional shape, up to a distance of 40 $\mu$m from the ultimate tip, defined by the equation:

$$w = ad^n \qquad (1)$$

where $w$ is the tip width, in $\mu$m, of the cutting edge at a distance $d$, in $\mu$m, from the ultimate tip, $a$ is a factor of proportionality having a value of $\leq 0.8$, and $n$ is an exponent having a value in the range 0.65 to 0.75. For actual cutting edges, the values of $a$ and $n$ can be determined by plotting $w$ against $d$ on logarithmic scales, a being given by the intercept on the line $d = 1$ and $n$ by the slope of the straight line. However, it can be seen from the equation that, in effect, $a$ is the calculated thickness, i.e. tip width $w$, when $d$ is 1 $\mu$m.

In practice it is found that for the stainless steels currently used for razor blades, the actual tip width or thickness at 1 $\mu$m should be more than 0.7 $\mu$m in order to minimize damage to the cutting edge during shaving, but less than 1.0 $\mu$m in order to obtain a comfortable shave.

The value of the exponent $n$ is equally or more important than the value of $a$ since it ($n$) determines the shape of the edge. A value of 0.5 defines a parabola, while a value of 1.0 defines a simple wedge. Previous cutting edges had $n$ values of more than 0.75; the cutting edges defined in the British specification referred to above have $n$ values of from 0.65 to 0.75.

Equation (1) holds for cutting edges made of any material, but to maintain $a$ in the same numerical range as for steels, the equation is modified, for other materials, to:

$$w = \frac{1}{\sqrt{m}} ad^n \qquad (2)$$

where $m$ is the ratio of the yield strength of the material in question to that of steel. It follows that for materials with a higher yield strength than steel, the cutting edges will be thinner than the corresponding steel cutting edges.

The above British specification also describes composite cutting edges, that is edges comprising a substrate cutting edge of stainless steel and a coating thereon of a material having a higher yield strength than stainless steel. In this case, the composite cutting edge cross-sectional shape should satisfy two equations $$w \geq \frac{1}{\sqrt{m}} ad^n \qquad (3)$$

and $$w^3 \geq (w - 2h) a^2 d^{2n} \qquad (4)$$

where $h$ is the thickness, in $\mu$m, of the coating at the distance $d$, in $\mu$m, from the ultimate tip.

A method of making such composite cutting edges is described in International Application Publication No. WO87/04471 (corresponding to European Application 0255834). This specification describes a process in which a substrate cutting edge having a cross-sectional shape such that $$w \leq ad^n \qquad (5)$$

is coated with a material which is harder (i.e. has a greater yield strength) than the material of the substrate edge by a vapor deposition or sputtering process, if necessary in the presence of gaseous or vaporized molecules of another element or a compound of another element where it is desired to form the coating of a compound, at a pressure of less than $10^{-2}$ m bar, while simultaneously subjecting the cutting edge to ion bombardment with ions of sufficient mass and energy to cause sputter removal of the deposited material at a rate which is less than the rate of deposition, whereby a cutting edge formed of the deposited material and having a cross-sectional shape defined by the equation:

$$ad^n \geq w \geq \frac{1}{\sqrt{m}} ad^n \qquad (6)$$

and equation (4) above, and an ultimate tip radius of less than 500 Å, is obtained.

Substrate cutting edges having the required geometry for use in this process are difficult to manufacture consistently by conventional mechanical sharpening methods.

Earlier proposals for the sputter sharpening and single ion beam sharpening of cutting edges have been made, for example, in British Specifications 1350594, 1544129 and 1544130. It can be shown mathematically that the included angle ($\alpha$) generated when a blade edge is bombarded orthogonally with a uni-directional stream of ions is defined by the equation:

$$\alpha = \pi - 2\theta_c \qquad (7)$$

where $\theta_c$ is the incident angle of the ions with respect to the substrate at which the sputter removal rate is at a maximum. It follows that to obtain smaller tip angles, that is thinner blades, the value of $\theta_c$ must be increased. This can be achieved by either increasing the ion energy or reducing the ion mass. We have found that there are severe practical limitations in obtaining tip angles of less than 30°. Increasing the ion energy can lead to over-heating and consequent softening of the blade tip, while ions of lower mass have much lower sputtering yields and may require unacceptably long treatment times.

We have now found that the restrictions imposed by the use of a single ion source in terms of the mass and energy of the ions can be avoided and that cutting edges having low tip angles can be obtained more easily and more consistently by sputter removal of material from both sides of the cutting edge by ion bombardment with two ion sources, one on each side of a plane lying within the blade of which the cutting edge is a part and passing through the cutting edge. This method can be used to make cutting edges complying with the requirements of British Specification 2130955A in all sorts of suitable materials, that is in stainless steel and in materials having a greater yield strength (or fracture strength in the case of more brittle materials) than stainless steel, such as sapphire, boron nitride, and titanium nitride. It can thus be used to make the substrate cutting edges required for the process of International Application WO 87/04471.

It can also be used to make cutting edges having a wide variety of other cross-sectional shapes.

According to one aspect of the present invention, therefore, there is provided a method of forming or modifying the cutting edges of razor blades, which comprises subjecting a stack of razor blades to ion bombardment from two ion sources in a vacuum chamber, the ion sources being located on opposite sides of a plane which lies within the stack and parallel to the major surfaces of the blades and the ion sources having the axes of their ion beams directed at the edges of the razor blades in the stack and the ion bombardment being effected with ions of sufficient mass and energy, in relation to the material of which the razor blades are formed, to cause sputter removal of the material of the blades on both sides of the edges thereof to thereby form or modify their cutting edges.

According to another aspect of the invention, there is provided apparatus for carrying out the method according to the invention, which apparatus comprises a sealable vacuum chamber and located therein a workpiece holder and two ion sources for effecting ion bombardment, the ion sources being located so that they are on opposite sides of a plane contained within a stack of razor blades mounted in the workpiece holder and so that the axes of the ion beams produced by the ion sources are directed at the edges of the razor blades when a stack of blades is so mounted.

In a preferred embodiment of the apparatus each ion source is radially aligned with respect to an arc centered on an axis lying in a stack of blades when so mounted and is angularly movable along the arc specified. In this way the apparatus can be readily modified to provide a variety of bombardment angles, if desired during the course of a single treatment.

The method of the invention can also be used as part of a two stage process in which a fine cutting edge is first formed in a substrate material, such as stainless steel, and then in a second stage the method is operated with simultaneous deposition of a coating material having a greater yield or fracture strength than the substrate material in a procedure analogous to that described in International Application WO 87/04471. In the second stage, the ion bombardment serves to refine and shape the coating as it is laid down; the rate of material removal by the ion bombardment should, of course, be less than the rate of deposition.

The bombarding ions used in the method of the invention may be inert to the razor blade material (or the coating material) or may be reactive therewith. The power density of the ion bombardment should not be so high that thermal degradation of the razor blades, in particular the yield strength of the latter, takes place, but should, in principle, be as high as possible subject to this limitation so that processing time is minimised. In the case of stainless steel, it has been found that the maximum power input should be less than 5 w/cm$^2$ in order to avoid thermal degradation.

It is generally preferred to use inert gas ions, more preferably argon ions, as the bombarding ions, but other ions that can be used include, for example, nitrogen and oxygen.

For the further understanding of the invention, preferred embodiments of suitable apparatus and particular modes of carrying out the method will now be described, by way of example, with reference to the accompanying drawings, in which:

FIGS. 4 to 7 are views generally similar to FIG. 2 and showing particular values of the bombardment angles and the predicted effects obtained by their use;

Figure 1:
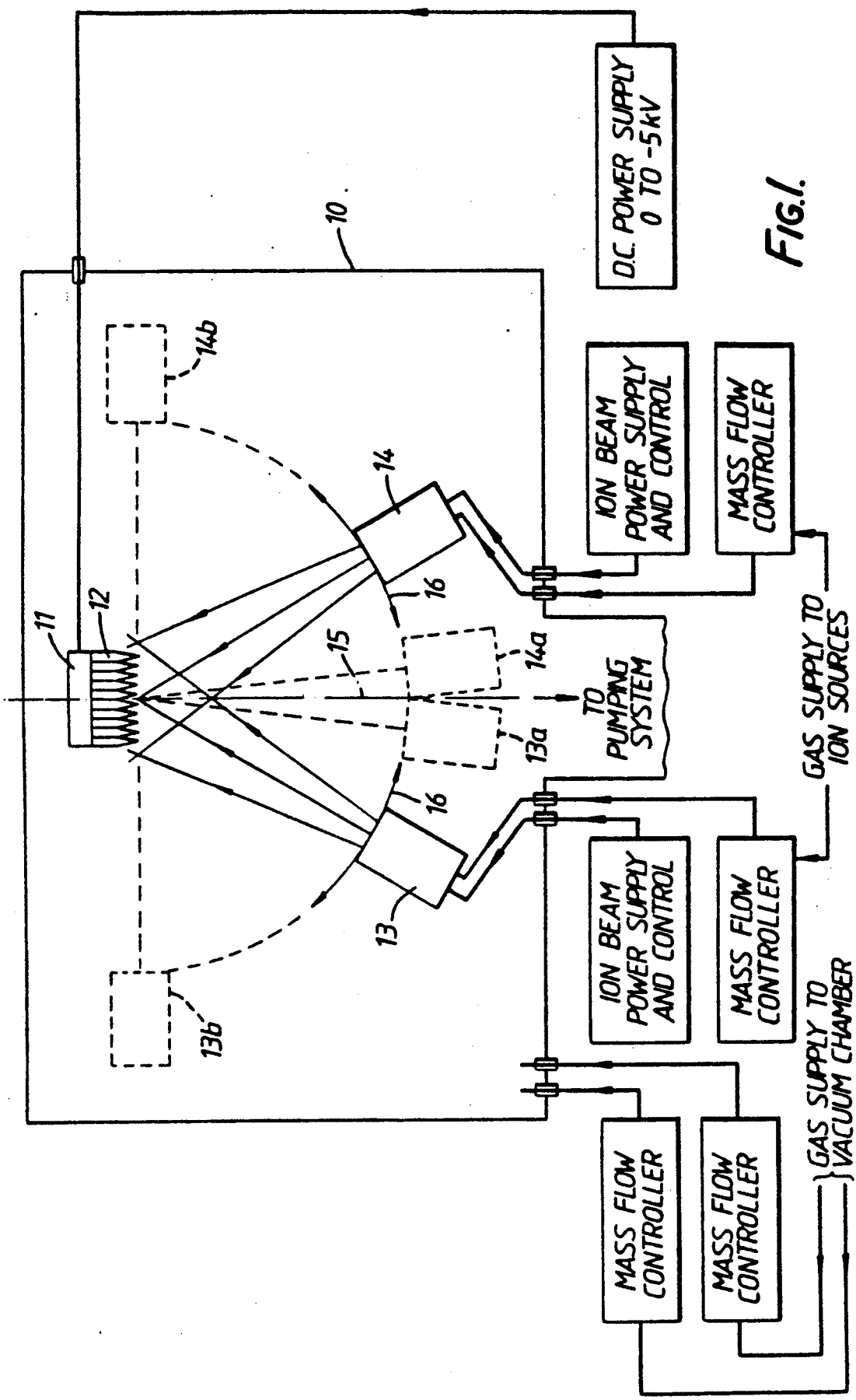
FIG. 1 is a diagrammatic representation of a preferred embodiment of apparatus according to the invention.

Referring to FIG. 1, the apparatus comprises a sealable vacuum chamber 10 connected to a vacuum pumping system (not shown) which is capable of pumping down to the necessary low pressure. The chamber is provided with means for introducing any desired gas or gases and with mass flow controllers therefor. The chamber contains a workpiece holder 11 and a workpiece 12 consisting of a stack of razor blades held therein or thereon. The blades are oriented as shown, that is end on with their cutting edges downwards. The workpiece holder preferably takes the form of a water-cooled knife. The holder is electrically connected to a DC power supply which can be adjusted from 0 to −5 kV so as to provide negative bias.

The chamber also contains two movable ion sources 13 and 14 for effecting ion bombardment. The ion sources 13 and 14 are located on opposite sides of a plane 15 contained within the workpiece 12 and are radially aligned with respect to an arc 16 centered on an axis lying in the workpiece 12. The ion sources 13 and 14 are angularly movable along the arc 16 while remaining radially aligned. The mounting of the ion sources for the purpose of such angular movement is such that they can be traversed from about 10° (shown in dashed lines at 13a,14a) to 90° (shown in dashed lines at 13b,14b) with respect to the plane 15 and the centre line of the ion beams emitted by the sources 13 and 14.

The apparatus may be such that angular adjustment of the ion sources 13 and 14 is effected manually when the chamber is open, that is when the equipment is being set up before a run or, preferably, drives (not shown) are provided within the chamber so that each ion source can be separately angularly moved without opening the chamber and while a run is taking place. The ion sources are provided with separate power supplies and controls therefor and with separate gas supplies and mass flow controllers therefor.

The ion sources may be any suitable commercially available units.

In operation, the ion sources will normally be operated at a voltage of at least 200 v, and preferably at a voltage of 1000 to 1500 v, and a current of from 20 to 100 mA, preferably 40 to 80 mA. The gas flow to provide the ions is typically from 2 to 10 ml/min, preferably 3 to 5 ml/min. The substrate bias is preferably 0 to −3kv.

Figure 2:
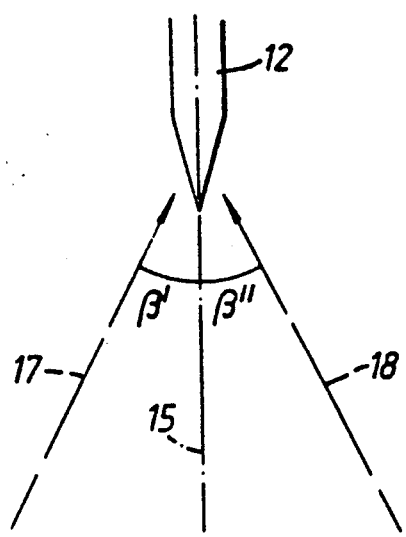
FIG. 2 is a fragmentary view, on an enlarged scale, of part of FIG. 1 to illustrate certain parameters of the method.

The angle between the axis of the ion sources 13 and 14 and the plane 15 referred to above, that is the bombardment angle, is more clearly seen in FIG. 2. The angle, identified as $\beta'$ and $\beta''$, is the angle between the central axis of the ion beams 17 and 18 emitted by sources 13 and 14, respectively, and the plane 15. Where it is required to obtain a symmetrical effect on the opposite faces of the workpiece 12, the angles $\beta'$ and $\beta''$ will be the same, but to obtain asymmetric products these angles will be different as described below. Where a single angle $\beta$ is referred to below, it is to be understood that $\beta'$ and $\beta''$ are the same.

The effects obtained by the method according to the invention are dependent on a number of factors. For a given bombarding ion, voltage and current (which may typically be argon, 1 kV and 80 mA respectively), there is a relationship between the amount of material removed (S) and the angle of incidence, that is the angle the beam makes with the surface normal ($\theta$); the relationship may be plotted as an (S,$\theta$) curve and such curves have been established for a number of materials and published in the literature, see, for example, G. Carter et al, *Radiation Effects*, 1977(31), 65–87.

Figure 3:
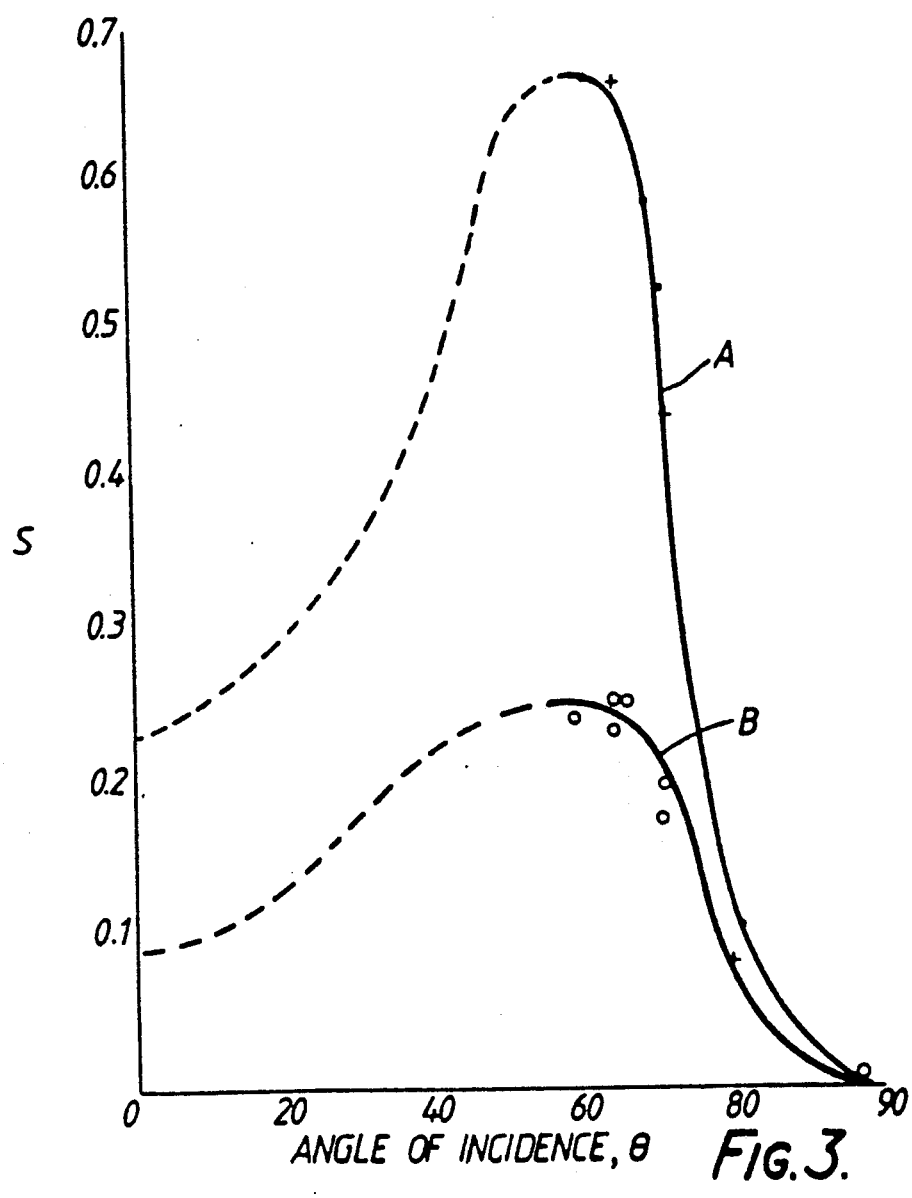
FIG. 3 shows S, $\theta$ curves for two different materials.

Typical (S,$\theta$) curves are shown in FIG. 3. In this figure, S, the amount of material removed in $\mu$m is plotted against the angle of incidence. Curve A was obtained for stainless steel and curve B for a boron/boron nitride mixture containing 10 atomic % nitrogen. For both materials the conditions of bombardment were as mentioned above, that is bombarding ion, argon; voltage, 1 kV; and current, 80 mA; the treatment was continued for 10 minutes.

It will be seen that under these conditions, the maximum removal of stainless steel was at an angle of incidence of 60°–62°, while for boron/boron nitride it was about 55°.

The predicted effects (from a computer model) obtained with various choices of bombardment angle $\beta$ and bombardment time are shown, by way of example, schematically in FIGS. 4 to 7. Each of these Figures shows the bombardment of a stainless steel cutting edge with argon ions at a voltage of 1 kV and with a current of 80 mA. The solid line shows the surface of the cutting edge before bombardment and the dashed (or other broken) line, the surface after bombardment; the figures on the right hand side shown the distance in micrometers from the ultimate tip.

Figure 4:
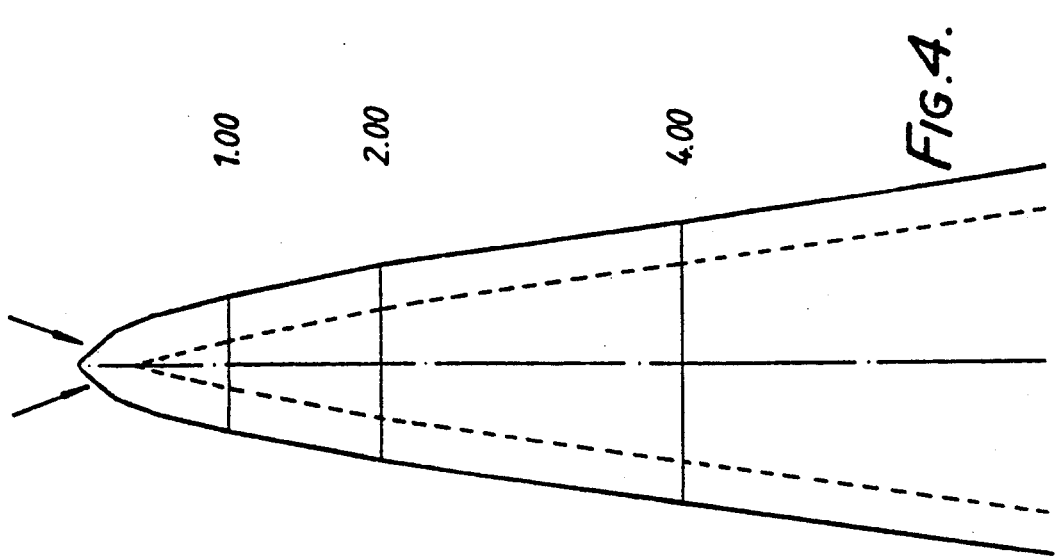

FIG. 4 shows bombardment at an angle of 20° for 5 minutes. Facets having a semi-angle of 10° are formed, resulting in a thinning of the blade.

At bombardment angles of more than 20°, maximum erosion will occur to form facet angles of even less than 10°. However, the effect of removing fractions of a micrometer in parts of the cutting edge relatively removed from the ultimate tip would be negligible and thinning of the tip region would be slower (than with a bombardment angle of 20°).

Figure 5:
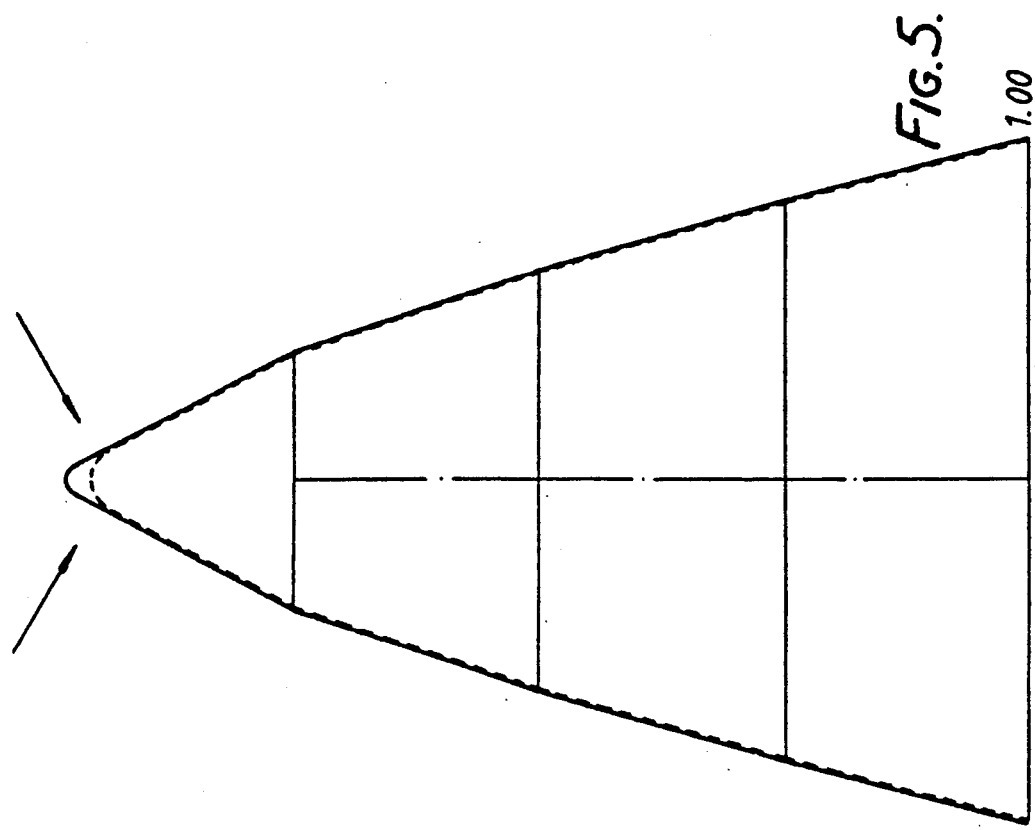

FIG. 5 shows bombardment at an angle of 60° for 30 seconds (it should be noted that the scale of this Figure is much larger than that of FIG. 4).

At this angle, the greatest erosion is at the ultimate tip (at which the normal to the blade surface lies on the blade axis) giving rise to a "truncating" effect so that the ultimate tip is thickened to a higher tip radius.

FIG. 6 shows the effect obtained by asymmetric treatment, one beam being aligned at 0° and the other at 30 and bombardment being effected for 10 minutes.

The resulting cutting edge is asymmetric (chisel-shaped); such cutting edges are desirable in certain types of razor.

FIG. 7 shows the use of dual beam ion bombardment to rectify a fault arising from the mechanical finishing of a cutting edge. The initial cutting edge has a turned-over ultimate tip. By bombarding with both beams at an angle of 20°, a much thinner cutting edge with a symmetrical fine ultimate tip (the inner dashed line) is obtained.

Each of the foregoing examples, FIGS. 4 to 7, describe treatments in which a bombardment angle or angles is/are chosen and then maintained throughout the treatment. The bombardment angle of one or both ion sources can, however, be intermittently or continuously varied during the course of the treatment in order to obtain combinations of effects.

Figure 8:
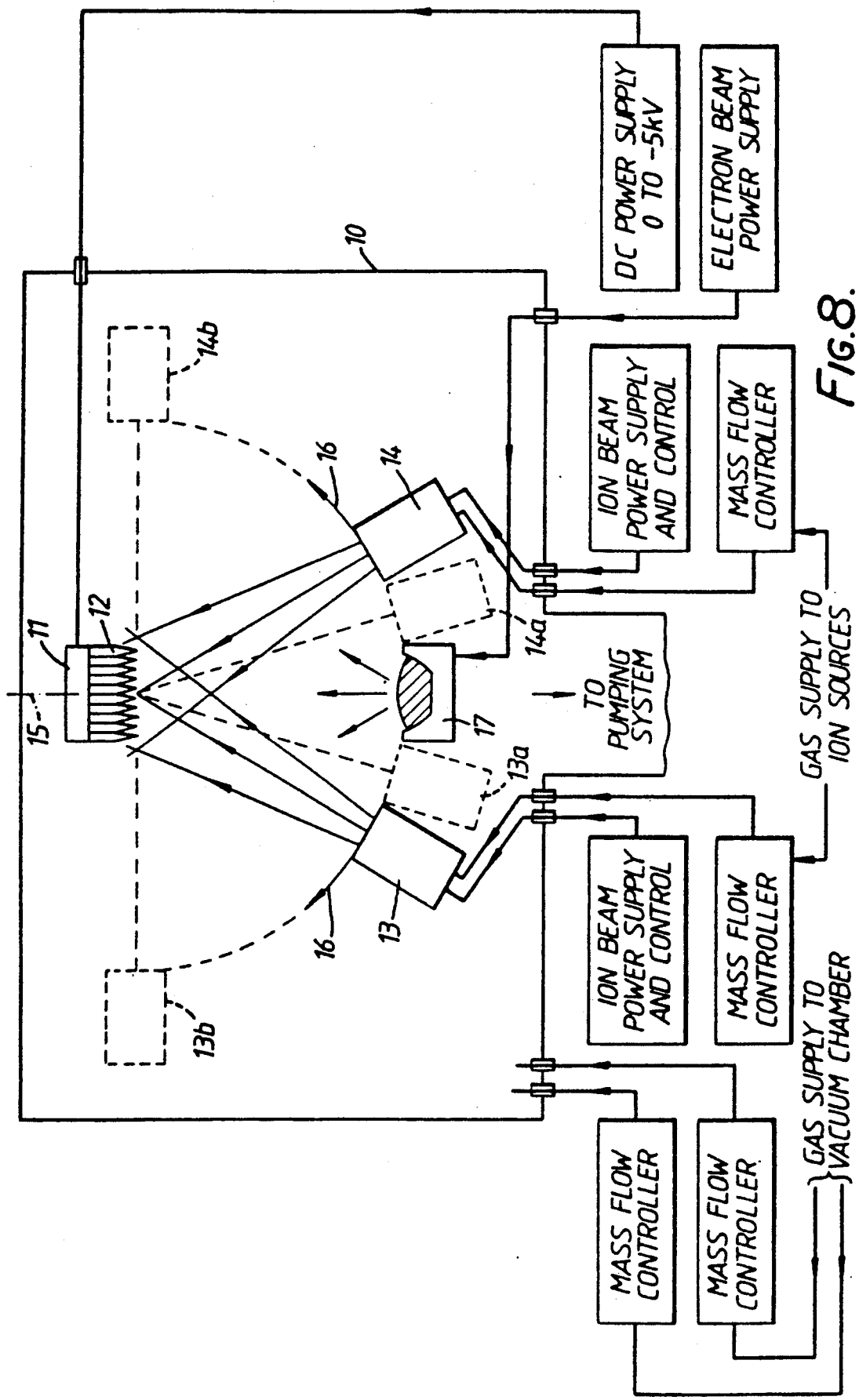
FIG. 8 is a diagrammatic representation of a preferred embodiment of apparatus for carrying out formation of a cutting edge substrate and forming a shaped coating thereon.

A preferred embodiment of apparatus for carrying out substrate shaping and the formation of a shaped coating thereon is shown in FIG. 8. The apparatus is essentially the same as the apparatus of FIG. 1 and the same elements have been given the same reference numerals, but the apparatus of FIG. 8 additionally comprises an electron beam evaporation device 17 which is provided with a suitable power supply.

The electron beam evaporator may be any suitable commercially available unit.

In use, the electron beam evaporator is not initially operated and the two ion sources are operated in order to obtain the desired form of substrate cutting edge. When this has been obtained, the electron beam evaporator is operated to vaporize the desired coating material or component thereof where the coating is a compound, and operation of the ion sources is continued. From the point when deposition is commenced the sputter removal rate due to the ion sources should, of course, be less than the deposition rate and operation of the ion sources may have to be adjusted to ensure this.

The operation of the ion sources may generally be as described above in relation to FIG. 1. Suitable conditions for the electron beam evaporation are, for example, a beam voltage of 5.5 to 10 kv, preferably about 10 kv, and a beam current of 100 to 500 mA, preferably 150 to 350 mA.

Whilst the illustrated embodiment includes an electron beam evaporator, the coating material or component thereof can be evaporated for the purpose of deposition in other ways, for example, by sputtering, resistive evaporation, or induction heating.

Suitable coating materials include, for example, metal oxides, nitrides, carbides and borides, and mixtures of a metal and an oxide, nitride or carbide thereof. Preferred coating materials include, for example, alumina (sapphire), tungsten carbide, titanium nitride, boron carbide, boron nitride, and mixtures of boron and boron nitride, and diamond-like carbon.

Nitride coatings, for example TiN and BN, are preferably formed by electron beam evaporation of the metal, for example titanium or boron, with nitrogen present in the chamber 10 in an amount required for the coating to be formed of the desired metal nitride. Coatings consisting of a mixture of such a nitride and the corresponding metal, such as a coating of boron/boron nitride containing 10 atomic % of nitrogen, are also of interest. These coatings may be obtained by restricting the amount of nitrogen present in the chamber to that required to give the desired conversion of the deposited metal to its nitride.

The boron/boron nitride mixture referred to above has a Vickers hardness of 3000 to 4000 kg/mm$^2$ and is thus considerably harder than titanium nitride which has a Vickers hardness of 2000 kg/mm$^2$.

Carbide coatings, for example TiC and B$_4$C, are preferably formed in a similar way, but with a gaseous or vaporized hydrocarbon present in place of nitrogen, the amount of hydrocarbon being sufficient to provide the amount of carbon to form the desired carbide.

Oxide coatings, for example Al$_2$O$_3$, are preferably evaporated directly, but may be formed in a similar way, but with oxygen present in place of nitrogen and the amount of oxygen being sufficient to provide the amount required to form the desired oxide.

A further coating material which may be used is diamond-like carbon (DLC), for which the formation of coatings can also be achieved by an alternative method. Since this material consists of carbon alone, it is possible to produce a coating by the introduction of a gaseous or vaporized hydrocarbon directly into the vacuum chamber or via the ion sources. Suitable hydrocarbons include, for example, methane, butane, propane and acetylene. The ion bombardment is, of course, carried out as described for other coating materials. In addition an RF glow discharge may be used in the deposition chamber to form the diamond-like carbon while simultaneously bombarding with an ion beam.

Although we have referred above to coatings formed of single compounds or mixtures, coatings of two or more different materials (that is, multilayer coatings) may be formed by the method according to the invention. The formation of coatings in two or more layers is primarily of interest when the outer or final coating does not have the desired adhesion to the substrate cutting edge. In such cases, a first coating is formed of a material which has good adhesion to the substrate and to which the desired outer coating has good adhesion, and the outer coating is then formed. An example is the improved adhesion of diamond-like carbon when deposited with an interlayer of a metal such as chromium or titanium.

A phenomenon which has been observed during the ion beam shaping phase of the process is the formation of bands of material on the blade edges. These bands, best observed by optical microscopy, lie parallel to the ultimate tip of the blade.

Figure 9:
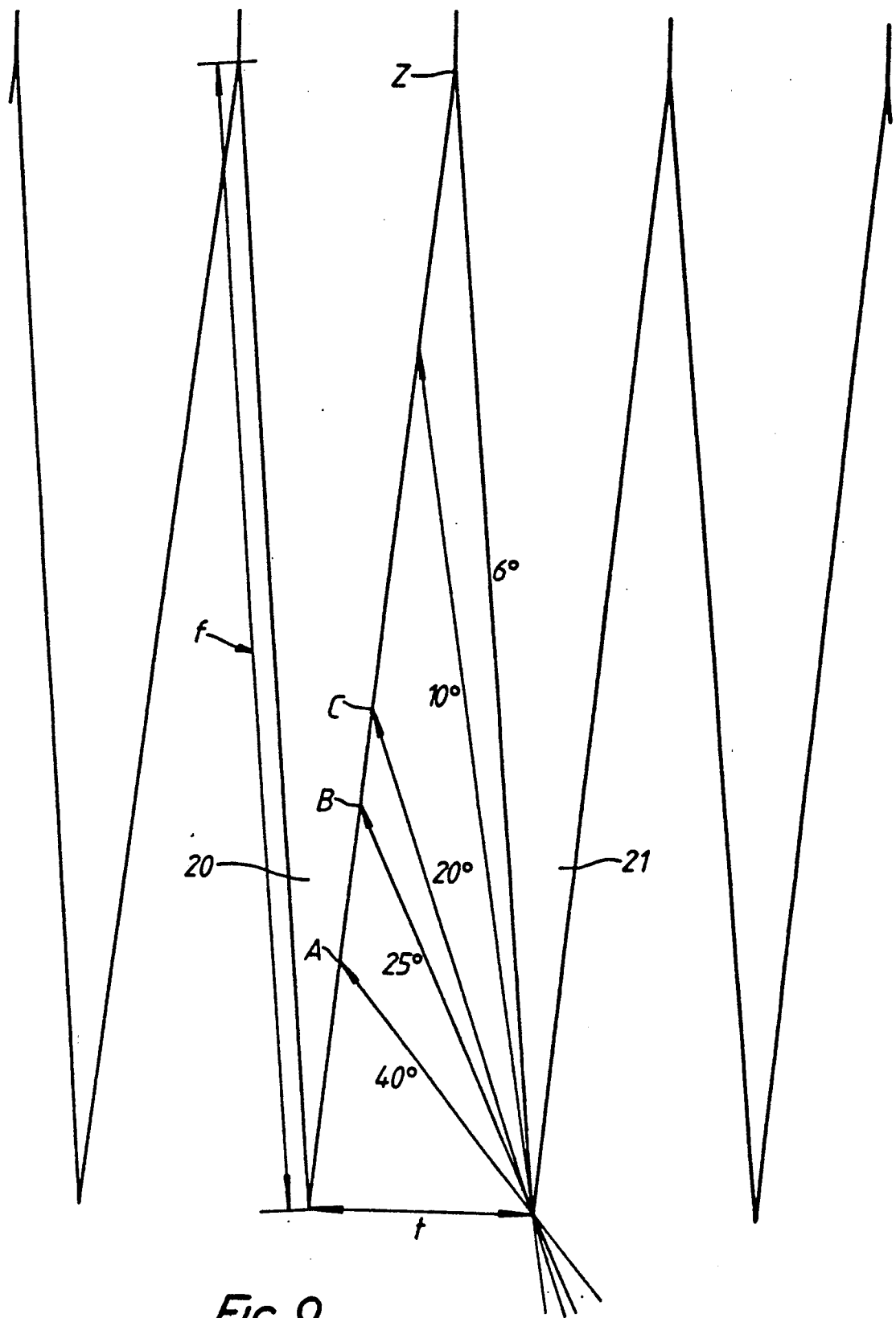
FIG. 9 is a diagrammatic end on view of four blade edges in a stack.

The formation of these bands is due to the shadowing of a portion of each cutting edge from the ion beam by the adjustment blade in the stack and the position of the bands has been found to be dependent on the bombardment angle. The phenomenon is illustrated in FIG. 9 which shows four blades in a stack, oriented as shown in FIG. 1 and 8. The blades have a body thickness of t, which is typically 100 $\mu$m, and a cutting edge depth or facet length, f, which is typically 500 $\mu$m. At a bombardment angle of 40°, the cutting edge of blade 20 is shadowed from the ion beam from point A to Z by the tip of the adjacent blade 21; at an angle of 25°, the cutting edge is shadowed from B to Z, and so on. For a facet length of 500 $\mu$m, it is only at bombardment angles of 6° or less that there is no shadowing effect on the facets, although for practical purposes angles of less than 10° produce no deleterious effects in use.

As a consequence of the shadowing, the portion of the facets beyond the relevant points A, B, etc. is not bombarded by the ion beam, such that material sputtered off the bombarded portions of blades 20 and 21 can be redeposited on the unbombarded portion, thus building up a film of sputtered material. It is this material that is seen as bands on the facets. The formation of such bands is undesirable as the material in them is readily detached from the underlying substrate during use of the blades. This detachment leads, in turn, to loss of any further coatings deposited at subsequent stages of the process, such as the hard coating which may be deposited in the second stage of the present process, or the sputtered chromium or chromium-platinum, and polytetrafluoroethylene coatings which are conventionally applied to razor blade cutting edges; the loss of these coatings substantially reduces the performance of the blades.

It is also believed that the shadowing has an undesirable effect during the deposition phase of the process in that deposited material in the region A, B, etc. to Z will not be subjected to simultaneous ion bombardment. This prevents the coating from being properly refined and shaped and, as a result, thick and poorly adherent coatings are obtained.

The shadowing effect, and the formation of such undesirable bands, can be avoided (i) by the use of low bombardment angles, that are of less than about 10°, (ii) by the use of spacers between the blades in the stack, and (iii) by rotation of the stack about an axis lying in the plane 15 (FIGS. 1 and 8) and perpendicular to the blade edges.

As to the second of these alternatives, it is found that for blades in which t is 100 $\mu$m and f is 500 $\mu$m, the use of spacers having a thickness of two blades between each blade in the stack enables bombardment angles of up to 26° to be used with no shadowing effect.

Suitable combinations of spacer thickness and maximum bombardment angle can readily be worked out or determined empirically for other blade geometries.

Figure 10A:
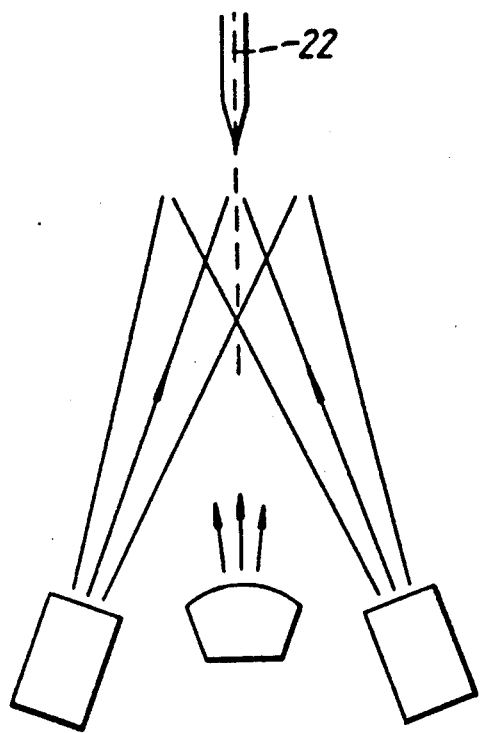
FIGS. 10a and 10b are views similar to FIG. 8 showing rotation of the blade stack.
Figure 10B:
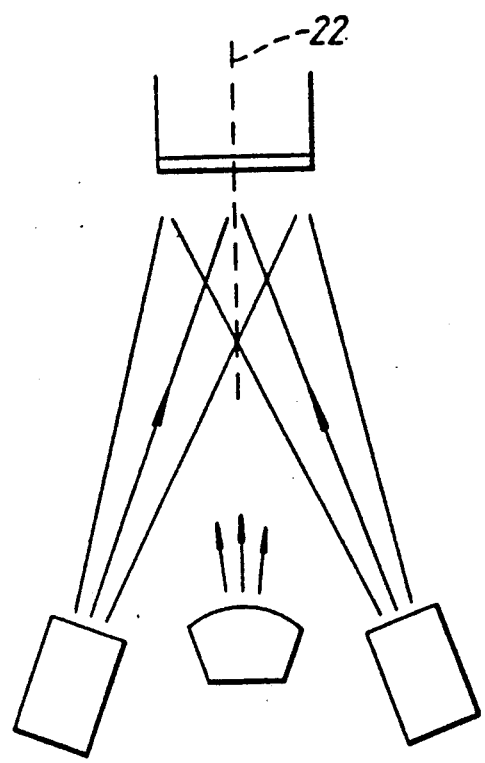

The third of the above alternatives is illustrated in FIG. 10a and 10b. FIG. 10a is a very diagrammatic representation of the arrangement shown in FIG. 8 and shows the orientation of the blade edges as described hitherto; the Figure also shows an axis 22, lying in the plane 15 (FIG. 1 and 8) and perpendicular to the blade edges. If the blade stack is rotated about the axis 22 by 90°, the arrangement shown in FIG. 10b is obtained. For the purpose of description, the orientation in FIG. 10a will be taken as 0° and that in FIG. 10b as 90°; the angle of orientation of the blade stack between these limits will be referred to as $\phi$.

It can be mathematically deduced that the relationship between the beam set angle $\theta$, (the angle between the axis of the ion beam and the axis 22), the bombardment angle $\beta$, and the blade stack orientation angle $\phi$ is given by the expression:

$$\sin \beta = \sin \theta \cos \phi$$

For a beam set angle of 25°, a bombardment angle of 10° can be obtained with a blade stack orientation angle of 65° and a bombardment angle of 6° can be obtained with a blade stack orientation angle of 75°. With blades having the geometry shown in FIG. 9, a blade stack orientation angle between these figures, 65° to 75°, will enable the shadowing effect to be substantially or completely avoided.

In order that the invention may be more fully understood, the following examples are given by way of illustration only:

EXAMPLE 1

The shaping of stainless steel razor blade cutting edges was carried out in apparatus as shown in FIG. 1. The ion guns 13 and 14 were 30.0 mm Kaufmann ion guns; the guns were positioned symmetrically at a $\beta$ angle of 25°. The substrate holder was positioned 300 mm above the ion sources; at this distance, the ion beam had a diameter of about 100 mm allowing a maximum current density of about 1mA/cm$^2$. The energy of the ions was set at 1.5 kv.

The workpiece was a stack of sharpened stainless steel razor blades and it was aligned as shown in the Figure. The cutting edges had been formed by conventional mechanical sharpening. The shape of the cutting edges was measured in a pre-selected portion of the edge before treatment using the technique described in British Specification 2130955A.

The chamber was closed, sealed and evacuated to a pressure of less than $10^{-6}$ mbar and 3.3 ml/min argon was then admitted into each of the ion guns, thus raising the chamber pressure to $1 \times 10^{-4}$ mbar. The ion guns were activated and bombardment was carried out for 10 minutes using a beam current of 50 mA. The blades were removed from the chamber and their tip shape was re-measured in the same pre-selected portion of the edge as before treatment.

The results obtained were as follows:

| Distance from ultimate tip. (μm) | Tip width, in μm Before Treatment | After Treatment |
| --- | --- | --- |
| 0.25 | 0.24 | 0.21 |
| 0.5 | 0.41 | 0.35 |
| 1.0 | 0.64 | 0.55 |
| 2.0 | 1.00 | 0.91 |
| 4.0 | 1.63 | 1.52 |
| 8.0 | 2.71 | 2.60 |
| 12.0 | 3.66 | 3.51 |
| 16.0 | 4.51 | 4.36 |
| 20.0 | 5.30 | 5.14 |
| 30.0 | 7.13 | 6.94 |
| 40.0 | 8.86 | 8.66 |

The shape measurements indicate that the cutting edge had been thinned.

EXAMPLE 2

The shaping of stainless steel razor blade cutting edges followed by the coating of the edges with a boron/boron nitride mixture was carried out in apparatus as shown in FIG. 8.

The ion guns 13 and 14, their orientation, and the spacing of the workpiece holder from the ion guns were as described in Example 1. The electron beam evaporator 17 was a 10 kv Electrotech ET15 unit; it was charged with boron.

Stainless steel blades which had been mechanically sharpened were mounted in the workpiece holder and subjected to argon ion bombardment as described in Example 1 except that a negative bias of 3 kv was applied to the workpiece holder. At the end of the 10 minute period referred to that Example, 20 ml/min of nitrogen was admitted into the chamber along with the 3.3 ml/min of argon into each source and while maintaining the beam voltage of the ion guns at 1.5 kv and the negative bias of $-3$ kv applied to the workpiece holder, the beam current was increased from 50 mA to 60 mA.

At the same time, that is simultaneously with the admission of the nitrogen, the electron beam evaporator was actuated using a beam voltage of 10 kv and a beam current of 215 mA. The chamber pressure during this second, deposition, stage was maintained at $1.1 \times 10^{-4}$ mbar. The deposition stage, with simultaneous ion bombardment, was continued for 10 minutes.

After treatment the cutting edges were measured as in Example 1. The following results were obtained.

| Distance from ultimate tip, (μm) | Tip width in μm after treatment |
| --- | --- |
| 0.1 | 0.15 |
| 0.25 | 0.25 |
| 0.5 | 0.38 |
| 1.0 | 0.56 |
| 2.0 | 0.85 |
| 4.0 | 1.69 |
| 8.0 | 2.90 |
| 12.0 | 3.90 |
| 16.0 | 4.90 |
| 20.0 | 5.24 |
| 30.0 | 7.23 |
| 40.0 | 9.23 |
| Calculated a value: 0.74 | |
| n value: 0.67 | | calculated from equations (4) and (6) taking into account the coating thickness and yield strength. It is seen that the cross-sectional profile lies between the limits defined in equations (4) and (6).

EXAMPLE 3

Example 2 was repeated, but with spacers between the blades in the stack and with rotation of the blades about a vertical axis (procedures (ii) and (iii) above in order to avoid the formation of shadowing bands.

The set up was as described in Example 2 except (i) each blade in the stack was separated from the adjacent blades by a spacer having a thickness of one blade and (ii) the blade stack was rotated through a $\phi$ angle of 65° so as to give a bombardment angle $\beta$ of 10°.

Ion beam sharpening was effected using a beam voltage of 1.5 kv and a beam current of 45 mA on each ion source for a period of 5 minutes; the substrate bias was zero.

At the end of this 5 minute sharpening/cleaning period, nitrogen was admitted into the chamber at a flow rate of 50 ml/min and at the same time the electron beam evaporator was activated using a beam voltage of 10 kv and a beam current of 260 mA. Deposition with simultaneous ion bombardment was continued for 7 minutes. The cutting edge of the resulting blades were then measured as in Examples 1 and 2.

The following results were obtained.

| Distance from ultimate tip, (μm) | Tipe width in μm after treatment |
| --- | --- |
| 0.25 | 0.31 |
| 0.50 | 0.58 |
| 0.75 | 0.70 |
| 1.00 | 0.85 |
| 1.50 | 1.06 |
| 2.00 | 1.25 |
| 3.00 | 1.58 |
| 4.00 | 1.89 |
| 6.00 | 2.47 |
| 8.00 | 3.00 |
| 10.00 | 3.49 |
| 12.00 | 3.96 |
| 14.00 | 4.40 |
| 16.00 | 4.82 |
| 20.00 | 5.64 |
| 25.00 | 6.62 |
| 30.00 | 7.56 |
| 35.00 | 8.48 |
| 40.00 | 9.40 |
| Calculated a value: 0.82 | |
| n value: 0.66 | | calculated from equations (4) and (6) taking into account the coating thickness and yield strength. It is seen that the cross sectional profile lies between the limits defined in equations (4) and (6).

In a shave test which compared these ultrafine edges with stainless steel edges of conventional edge geometry, the ultrafine edges were shown to have significantly superior shaving performance.

We claim:

1. A method of forming or modifying the cutting edges of razor blades, which comprises subjecting a stack of razor blades to ion bombardment from two ion sources in a vacuum chamber, the ion sources being located on opposite sides of a plane which lies within the stack and parallel to the major surfaces of the blades and the ion sources having the axes of their ion beams directed at the edges of the razor blades in the stack and the ion bombardment being effected with ions of sufficient mass and energy, in relation to the material of which the razor blades are formed, to cause sputter removal of the material of the blades on both sides of the edges thereof to thereby form or modify their cutting edges.

2. A method according to claim 1, in which the ion bombardment is operated to provide cutting edges in which:

$$w \leq ad^n$$

in which w is the tip width, in μm, of the cutting edge at a distance d, in μm, from the ultimate tip, and n is a factor of proportionality between 0.7 to 1.0, a n is an exponent having a value of from 0.65 to 0.75.

3. A method according to claim 1, in which the razor blades are formed of stainless steel.

4. A method according to claim 1, in which the razor blades are formed of a material which has a greater yield strength or fracture strength than stainless steel.

5. A method according to claim 1, in which the bombarding ions are argon, nitrogen, or oxygen ions.

6. A method according to claim 1, in which the ion bombardment is carried out with the ion guns operated at a beam voltage of 1000 to 1500 v and a beam current of 40 to 80 mA and with a supply of gas to form the bombarding ions of 3 to 5 ml/min, and with the razor blade stack at a bias of 0 to −3kv.

7. A method according to claim 1, in which following formation or modification of the cutting edges, a material different from the razor blade material is deposited on the bombarded surfaces of the blades by evaporation while continuing the ion bombardment in order to refine and shape the coating of deposited material as it is laid down, the rate of material removal by the ion bombardment being less than the rate of deposition.

8. A method according to claim 7, in which the razor blades are formed of stainless steel and the deposited material which is coated on the cutting edges is a material having a greater yield strength or fracture strength than stainless steel.

9. A method according to claim 8, in which the deposited material is sapphire, boron nitride, a boron/boron nitride mixture, titanium nitride, or diamond-like carbon.

10. A method according to claim 8, in which the initial ion bombardment and then the coating with ion bombardment stages are operated to provide coated cutting edges in which $$ad^n \geq w \geq \frac{1}{\sqrt{m}} ad^n$$

and $$w^3 \geq (w - 2h) a^2 d^{2n}$$

in which w is the tip width, in μm, of the cutting edge at a distance d, in μm, from the ultimate tip, a is a factor of proportionality between 0.7 to 1.0, n is an exponent having a value of from 0.65 to 0.75, m is the ratio of the yield strength of the deposited material to that of stainless steel, and h is the thickness, in μm, of the coating at the distance d, in μm, from the ultimate tip.

11. A method according to claim 7, in which the deposited material or a component thereof is evaporated by electron beam evaporation.

12. A method according to claim 11, in which the electron beam evaporator is operated at a beam voltage of about 10 kv and beam current of from 150 to 350 mA.

13. A method according to claim 1, in which ion bombardment is effected with the plane which lies within the stack and parallel to the major surfaces of the blades making an angle of other than 90° with a plane containing the axes of both the ion beams, the angle being such that substantially the whole of the cutting edges of the blades is accessed by the ion beams.

14. Apparatus comprising a sealable vacuum chamber and located therein a workpiece holder and two ion sources for effecting ion bombardment, the ion sources being located so that they are on opposite sides of a plane contained within a stack of razor bladed adapted to be mounted in the workpiece holder and so that the axes of the ion beams produced by the ion sources are directed at the edges of the razor blades when a stack of blades is so mounted.

15. Apparatus according to claim 14, in which each ion source is radially aligned with respect to an arc centered on an axis lying in a stack of blades when so mounted and is angularly movable along said arc.

16. Apparatus according to claim 14, in which the vacuum chamber additionally contains an electron beam evaporator positioned to deposit material on a stack of blades mounted in the workpiece holder.

* * * * *